United States Patent
Jo et al.

(10) Patent No.: US 12,431,073 B2
(45) Date of Patent: Sep. 30, 2025

(54) DISPLAY APPARATUS

(71) Applicant: LG Display Co., Ltd., Seoul (KR)

(72) Inventors: Bo Eun Jo, Paju-si (KR); Yoo Min Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/739,997

(22) Filed: Jun. 11, 2024

(65) Prior Publication Data
US 2025/0246121 A1    Jul. 31, 2025

(30) Foreign Application Priority Data
Jan. 29, 2024    (KR) .................... 10-2024-0013101

(51) Int. Cl.
*G09G 3/32*    (2016.01)

(52) U.S. Cl.
CPC ....... *G09G 3/32* (2013.01); *G09G 2300/0426* (2013.01); *G09G 2310/0267* (2013.01); *G09G 2330/021* (2013.01)

(58) Field of Classification Search
CPC ............. G09G 3/32; G09G 2300/0426; G09G 2310/0267; G09G 2330/021
See application file for complete search history.

(56) References Cited

U.S. PATENT DOCUMENTS

| | | | | |
|---|---|---|---|---|
| 7,286,202 | B2* | 10/2007 | Yamaguchi | H01L 23/5389 345/98 |
| 2007/0290967 | A1* | 12/2007 | Jang | G09G 3/3677 345/87 |
| 2015/0163942 | A1 | 6/2015 | Wu | |
| 2016/0140896 | A1* | 5/2016 | Kwon | G09G 3/006 345/76 |
| 2018/0269269 | A1 | 9/2018 | Kim et al. | |
| 2019/0164877 | A1* | 5/2019 | Cho | H01L 23/528 |
| 2022/0320248 | A1 | 10/2022 | Bang et al. | |
| 2024/0029633 | A1 | 1/2024 | Won | |

FOREIGN PATENT DOCUMENTS

CN    212675816 U    3/2021

OTHER PUBLICATIONS

Intellectual Property Office of the United Kingdom, Combined Search and Examination Report, United Kingdom Patent Application No. GB2407760.4, Feb. 6, 2025, nine pages.

* cited by examiner

*Primary Examiner* — Patrick N Edouard
*Assistant Examiner* — Joseph P Fox
(74) *Attorney, Agent, or Firm* — Fenwick & West LLP

(57) ABSTRACT

A display apparatus may comprise a substrate including a display area and a non-display area around the display area, a gate driving part disposed at the non-display area on the substrate, a driving chip disposed at the non-display area on the substrate, a first line disposed on the substrate, the first line electrically connected to the driving chip, and a second line disposed between the substrate and the first line.

17 Claims, 9 Drawing Sheets

DISPLAY APPARATUS

CROSS-REFERENCE TO RELATED APPLICATION

This application claims priority to Republic of Korea Patent Application No. 10-2024-0013101, filed on Jan. 29, 2024, which is hereby incorporated by reference in its entirety.

BACKGROUND

Field

The present disclosure relates to a display apparatus, and more specifically, provides a display apparatus that may prevent or at least reduce screen defects.

Description of Related Art

As technology advances, display apparatuses that display images are becoming lighter and thinner. In addition to a display panel, a display apparatus may further include a driving circuit for driving the display panel. To make the display apparatus lightweight and thin, driving circuits and driving chips for driving the display panel may be disposed in the display panel.

SUMMARY

To place driving chips configure to drive the display panel in the display panel, techniques for physically attaching the driving chips to the display panel are used.

However, when the driving chip is physically attached to the display panel, a physical force is applied to the display panel for bonding between the driving chip and the display panel, so that defects, e.g., cracks, may occur in the display panel. This may result in cutoff of signal supply to the display panel, causing defects, such as screen abnormalities. Thus, the inventors of the disclosure have invented a new structure for display apparatuses, capable of preventing screen defects by minimizing or at least reducing defects, such as cracks, in the display panel.

An embodiment of the present disclosure provides a display apparatus capable of preventing screen defects by minimizing or at least reducing cracks that may occur when attaching the driving chip to the display panel.

A display apparatus according to an embodiment of the present disclosure comprises a substrate including a display area and a non-display area around the display area, a gate driving part disposed at the non-display area on the substrate, a driving chip disposed at the non-display area on the substrate, a first line disposed on the substrate, the first line electrically connected to the driving chip, and a second line disposed between the substrate and the first line.

A display apparatus according to an embodiment of the present disclosure comprises a substrate including a display area and a non-display area around the display area, a gate driving part disposed at the non-display area on the substrate, a driving chip disposed at the non-display area on the substrate, a first line disposed on the substrate and electrically connected to the driving chip, and a plurality of dummy electrodes at least some of which disposed on a same layer as the first line.

According to embodiments of the present disclosure, since a dual line is configured between a substrate and a protection layer, it is possible to prevent or at least reduce screen defects by minimizing or at least reducing cracks that may occur when attaching the driving chip to the display panel.

According to embodiments of the present disclosure, since a dual line is configured between a substrate and a protection layer, it is possible to prevent disconnection of a gate line by minimizing or at least reducing delamination of layers disposed around a driving chip.

According to embodiments of the present disclosure, since a dummy electrode is configured around a driving chip, it is possible to minimize or at least reduce delamination and cracks of layers disposed around the driving chip and to prevent or at least reduce disconnection and corrosion of a gate line.

According to embodiments of the present disclosure, there may be provided a display apparatus capable of low power consumption by preventing or at least reducing screen defects to enhance the lifespan of a display apparatus.

BRIEF DESCRIPTION OF DRAWINGS

The accompanying drawings, which are included to provide a further understanding of the disclosure, are incorporated in and constitute a part of the disclosure, illustrate aspects of the disclosure and together with the description serve to explain principles of the disclosure.

DETAILED DESCRIPTION

Figure 1:
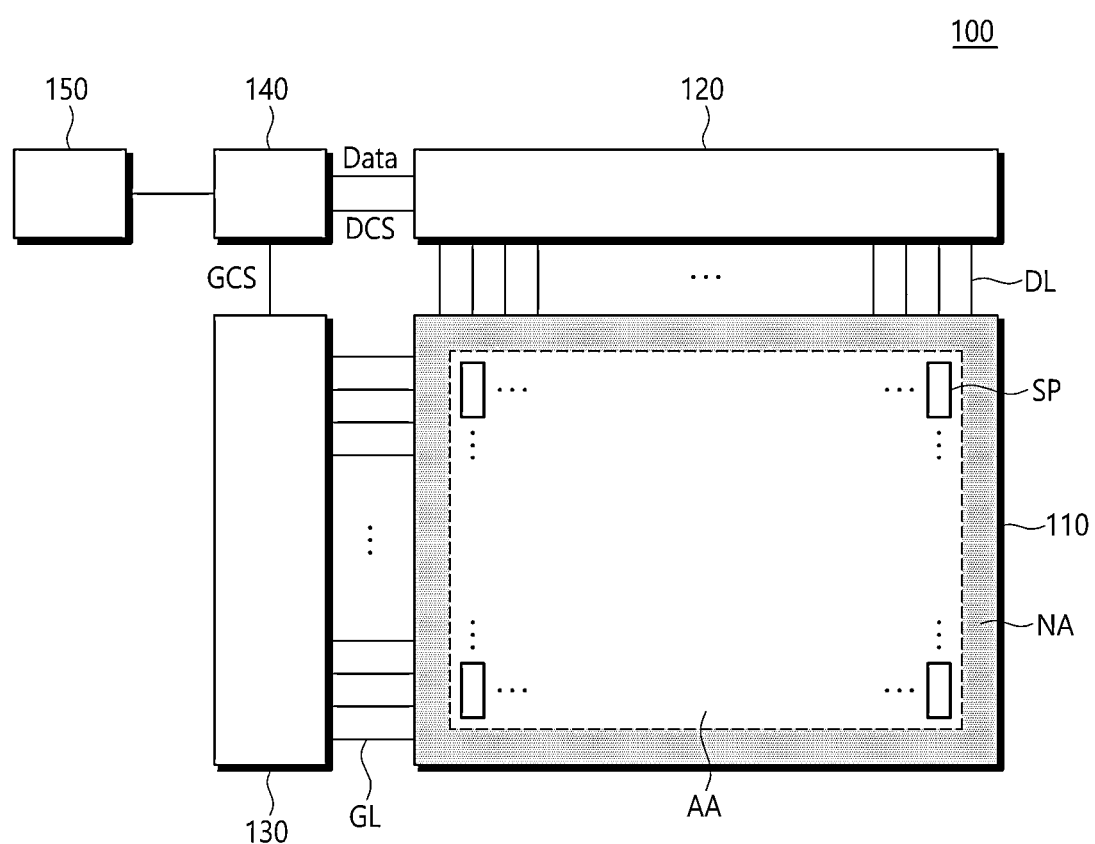
FIG. 1 illustrates a display apparatus according to embodiments of the present disclosure.

Reference is now made in detail to aspects of the present disclosure, examples of which may be illustrated in the accompanying drawings. In the following description, when a detailed description of well-known methods, functions, structures or configurations may unnecessarily obscure aspects of the present disclosure, a detailed description of such known functions or configurations may be omitted for brevity. Further, repetitive descriptions may be omitted for brevity. The progression of processing steps and/or operations described is a non-limiting example.

The sequence of steps and/or operations is not limited to that set forth herein and may be changed to occur in an order that is different from an order described herein, with the exception of steps and/or operations necessarily occurring in a particular order. In one or more examples, two operations in succession may be performed substantially concurrently, or the two operations may be performed in a reverse order or in a different order depending on a function or operation involved.

Unless stated otherwise, like reference numerals may refer to like elements throughout even when they are shown in different drawings. Unless stated otherwise, the same reference numerals may be used to refer to the same or substantially the same elements throughout the specification and the drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through the aspects described with reference to the accompanying drawings. The present disclosure may, however, be embodied in different forms and should not be construed as limited to the example aspects set forth herein. Rather, these example embodiments are examples and are provided so that this disclosure may be thorough and complete to assist those skilled in the art to understand the inventive concepts without limiting the protected scope of the present disclosure.

Shapes, dimensions (e.g., sizes, lengths, widths, heights, thicknesses, locations, radii, diameters, and areas), proportions, ratios, angles, numbers, the number of elements, and the like disclosed herein, including those illustrated in the drawings, are merely examples, and thus, the present disclosure is not limited to the illustrated details. It is, however, noted that the relative dimensions of the components illustrated in the drawings are part of the present disclosure.

Where a term like "comprise," "include," "have," "contain," "constitute," "made of," "formed of," "composed of," or the like is used with respect to one or more elements (e.g., layers, films, regions, components, sections, members, parts, regions, areas, portions, steps, operations, and/or the like), one or more other elements may be added unless a term, such as "only" or the like is used. The terms used in the present disclosure are merely used in order to describe example aspects, and are not intended to limit the scope of the present disclosure. The terms of a singular form may include plural forms, unless the context clearly indicates otherwise.

The word "exemplary" is used to mean serving as an example or illustration, unless otherwise specified. Embodiments are example embodiments. Aspects are example aspects. In one or more implementations, "embodiments," "aspects," "examples," and the like should not be construed to be preferred or advantageous over other implementations. An aspect, an example, an example aspect, or the like may refer to one or more aspects, one or more examples, one or more example aspects, or the like, unless stated otherwise. Further, the term "may" encompasses all the meanings of the term "can."

In one or more aspects, unless explicitly stated otherwise, an element, feature, or corresponding information (e.g., a level, range, dimension, size, or the like) is construed to include an error or tolerance range even where no explicit description of such an error or tolerance range is provided. An error or tolerance range may be caused by various factors (e.g., process factors, internal or external impact, noise, or the like). In interpreting a numerical value, the value is interpreted as including an error range unless explicitly stated otherwise.

In describing a positional relationship when the positional relationship between two parts (e.g., layers, films, regions, components, sections, or the like) is described, for example, using "on," "upon," "on top of," "over," "under," "above," "below," "beneath," "near," "close to," "adjacent to," "beside," "next to," "at or on a side of," or the like, one or more other parts may be located between the two parts unless a more limiting term, such as "immediate(ly)," "direct(ly)," or "close(ly)," is used. For example, where a structure is described as being positioned "on," "upon," "on top of," "over," "under," "above," "below," "beneath," "near," "close to," "adjacent to," "beside," "next to," "at or on a side of," or the like another structure, this description should be construed as including a case in which the structures contact each other as well as a case in which one or more additional structures are disposed or interposed therebetween. Furthermore, the terms "front," "rear," "back," "left," "right," "top," "bottom," "downward," "upward," "upper," "lower," "up," "down," "column," "row," "vertical," "horizontal," and the like refer to an arbitrary frame of reference.

Spatially relative terms, such as "below," "beneath," "lower," "on," "above," "upper" and the like, may be used to describe a correlation between various elements (e.g., layers, films, regions, components, sections, or the like) as shown in the drawings. The spatially relative terms are to be understood as terms including different orientations of the elements in use or in operation in addition to the orientation depicted in the drawings. For example, if the elements shown in the drawings are turned over, elements described as "below" or "beneath" other elements would be oriented "above" other elements. Thus, the term "below," which is an example term, can include all directions of "above" and "below." Likewise, an exemplary term "above" or "on" can include both directions of "above" and "below."

In describing a temporal relationship, when the temporal order is described as, for example, "after," "subsequent," "next," "before," "preceding," "prior to," or the like, a case that is not consecutive or not sequential may be included and thus one or more other events may occur therebetween, unless a more limiting term, such as "just," "immediate(ly)," or "direct(ly)," is used.

The terms, such as "below," "lower," "above," "upper" and the like, may be used herein to describe a relationship between element(s) as illustrated in the drawings. It will be understood that the terms are spatially relative and based on the orientation depicted in the drawings.

When describing signal flow, for example, "transmission of a signal from node A to node B," a case in which a signal is transmitted from node A to node B through one or more intervening nodes may be included, unless the term "immediately" or "directly" is used.

It is understood that, although the terms "first," "second," or the like may be used herein to describe various elements (e.g., layers, films, regions, components, sections, members, parts, regions, areas, portions, steps, operations, and/or the like), these elements should not be limited by these terms, for example, to any particular order, precedence, or number of elements. These terms are used only to distinguish one element from another. For example, a first element could be termed a second element, and, similarly, a second element could be termed a first element, without departing from the scope of the present disclosure. Furthermore, the first element, the second element, and the like may be arbitrarily named according to the convenience of those skilled in the art without departing from the scope of the present disclosure. For clarity, the functions or structures of these elements (e.g., the first element, the second element and the like) are not limited by ordinal numbers or the names in front of the elements. Further, a first element may include one or more first elements. Similarly, a second element or the like may include one or more second elements or the like.

In describing elements of the present disclosure, the terms "first," "second," "A," "B," "(a)," or "(b)," or the like may be used. These terms are intended to identify the corresponding element(s) from the other element(s), and these terms are not used to define the essence, basis, order, or number of the elements.

For the expression that an element (e.g., layer, film, region, component, section, or the like) is described as "connected," "coupled," "attached," "adhered," or the like to another element, the element can not only be directly connected, coupled, attached, adhered, or the like to another element, but also be indirectly connected, coupled, attached, adhered, or the like to another element with one or more intervening elements disposed or interposed between the elements, unless otherwise specified.

For the expression that an element (e.g., layer, film, region, component, section, or the like) "contacts," "overlaps," or the like with another element, the element can not only directly contact, overlap, or the like with another element, but also indirectly contact, overlap, or the like with another element with one or more intervening elements disposed or interposed between the elements, unless otherwise specified.

The phrase that an element (e.g., layer, film, region, component, section, or the like) is "provided," "disposed," "connected," "coupled," or the like in, on, with or to another element may be understood, for example, as that at least a portion of the element is provided, disposed, connected, coupled, or the like in another element, or that the entirety of the element is provided, disposed, connected, coupled, or the like in another element. The phrase that an element (e.g., layer, film, region, component, section, or the like) "contacts," "overlaps," or the like with another element may be understood as that at least a portion of the element contacts, overlaps, or the like with a least a portion of another element, that the entirety of the element contacts, overlaps, or the like with a least a portion of another element, or that at least a portion of the element contacts, overlaps, or the like with the entirety of another element.

The terms such as a "line" or "direction" should not be interpreted only based on a geometrical relationship in which the respective lines or directions are parallel or perpendicular to each other. Such terms may mean a wider range of lines or directions within which the components of the present disclosure can operate functionally. For example, the terms "first direction," "second direction," and the like, such as a direction parallel or perpendicular to "x-axis," "y-axis," or "z-axis," should not be interpreted only based on a geometrical relationship in which the respective directions are parallel or perpendicular to each other, and may be meant as directions having wider directivities within the range within which the components of the present disclosure can operate functionally.

The term "at least one" should be understood as including any and all combinations of one or more of the associated listed items. For example, each of the phrases "at least one of a first item, a second item, or a third item" and "at least one of a first item, a second item, and a third item", may represent (i) a combination of items provided by one or more of the first item, the second item, and the third item and (ii) only one of the first item, the second item, and the third item.

The expression of a first element, a second elements, "and/or" a third element should be understood to encompass one of the first, second, or third elements, one of the first, second, and third elements, as well as any and all combinations of the first, second and third elements. By way of example, A, B and/or C encompass only A; only B; only C; any of A, B, and C (e.g., A, B, or C); some combinations of A, B, and C (e.g., A and B; A and C; or B and C); and all of A, B, and C. Furthermore, an expression "A/B" may be understood as A and/or B. For example, an expression "A/B" can refer to only A; only B; A or B; or A and B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two. Furthermore, when an element (e.g., layer, film, region, component, sections, or the like) is referred to as being "between" at least two elements, the element may be the only element between the at least two elements, or one or more intervening elements may also be present.

In one or more aspects, the phrases "each other" and "one another" may be used interchangeably simply for convenience unless stated otherwise. For example, an expression "different from each other" may be understood as different from one another. In another example, an expression "different from one another" may be understood as different from each other. In one or more examples, the number of elements involved in the foregoing expression may be two. In one or more examples, the number of elements involved in the foregoing expression may be more than two.

In one or more aspects, the phrases "one or more among" and "one or more of" may be used interchangeably simply for convenience unless stated otherwise.

The term "or" means "inclusive or" rather than "exclusive or." For example, unless otherwise stated or clear from the context, the expression that "x uses a or b" means any one of natural inclusive permutations. For example, "a or b" may mean "a," "b," or "a and b." For example, "a, b or c" may mean "a," "b," "c," "a and b," "b and c," "a and c," or "a, b and c."

Features of various aspects of the present disclosure may be partially or entirely coupled to or combined with each other, may be technically associated with each other, and may be operated, linked, or driven together in various ways. Aspects of the present disclosure may be implemented or carried out independently from each other, or may be implemented or carried out together in a co-dependent or related relationship. In one or more aspects, the components of each apparatus according to various aspects of the present disclosure may be operatively coupled and configured.

Unless otherwise defined, the terms (including technical and scientific terms) used herein have the same meaning as commonly understood by one of ordinary skill in the art to which example aspects belong. It should be further understood that terms, such as those defined in commonly used dictionaries, should be interpreted as having a meaning, for example, consistent with their meaning in the context of the relevant art and should not be interpreted in an idealized or overly formal sense, unless expressly defined otherwise herein.

The terms used herein have been selected as being general in the related technical field; however, there may be other terms depending on the development and/or change of technology, convention, preference of technicians, and so on. Therefore, the terms used herein should not be understood as limiting technical ideas, but should be understood as examples of the terms for describing example aspects.

Further, in a specific case, a term may be arbitrarily selected by an applicant, and in this case, the detailed meaning thereof is described herein. Therefore, the terms used herein should be understood based on not only the name of the terms, but also the meaning of the terms and the content hereof.

"X-axis direction," "Y-axis direction" and "Z-axis direction" should not be construed by a geometric relation only of a mutual vertical relation and may have broader directionality within the range that elements of the present disclosure may act functionally.

In the following description, various example aspects of the present disclosure are described in detail with reference to the accompanying drawings. With respect to reference numerals to elements of each of the drawings, the same elements may be illustrated in other drawings, and like reference numerals may refer to like elements unless stated otherwise. The same or similar elements may be denoted by the same reference numerals even though they are depicted in different drawings. In addition, for convenience of description, a scale, dimension, size, and thickness of each of the elements illustrated in the accompanying drawings may be different from an actual scale, dimension, size, and thickness, and thus, aspects of the present disclosure are not limited to a scale, dimension, size, and thickness illustrated in the drawings.

Hereinafter, a variety of embodiments will be described in detail with reference to the accompanying drawings.

FIG. 1 illustrates a display apparatus according to embodiments of the present disclosure.

A display panel 110 may include signal lines, such as a plurality of data lines DL and a plurality of gate lines GL. The display panel 110 may include a plurality of subpixels SP connected with the plurality of data lines DL and the gate lines GL.

The display panel 110 may include a display area AA in which images are displayed and a non-display area NA in which no image is displayed.

In the display area AA, signal lines such as the plurality of data lines DL and the plurality of gate lines GL may be disposed, and the plurality of subpixels SP configured to display images may be disposed. In the non-display area NA, the signal lines disposed in the display area AA may be disposed to extend, the data driving part 120 or the gate driving part 130 may be mounted, or pad parts where the data driving part 120, the gate driving part 130, or the printed circuit is connected may be disposed.

A timing controller 140 may supply a data control signal DCS to the data driving part 120 to control the operation timing of the data driving part 120. The timing controller 140 may supply a gate control signal GCS configured to control the operation timing of the gate driving part 130 to the gate driving part 130.

The timing controller 140 may start gate driving (scanning) according to a timing implemented in each frame, convert an input image data (or an image signal) input from an external host module 150 into an image data Data according to the data signal form used in the data driving part 120, supply the image data Data to the data driving part 120, and control data driving at an appropriate time according to the gate driving.

The timing controller 140 may receive, from the outside (e.g., a host system), various timing signals including a vertical synchronization signal VSYNC, a horizontal synchronization signal HSYNC, an input data enable signal DE, and a clock signal, along with the input image data (image signal). However, the timing signals are not limited thereto.

To control the data driving part 120 and the gate driving part 130, the timing controller 140 may receive timing signals, such as the vertical synchronization signal VSYNC, horizontal synchronization signal HSYNC, input data enable signal DE, and clock signal CLK, generates various control signals DCS and GCS, and output the control signals to the data driving part 120 and the gate driving part 130.

For example, to control the gate driving part 130, the timing controller 140 may output various gate control signals GCS including a gate start pulse GSP, a gate shift clock GSC, and a gate output enable signal GOE.

A gate start pulse GSP may control an operation start timing of one or more gate driver integrated circuits constituting each gate driving part 130. A gate shift clock GSC is a clock signal commonly input to one or more gate driver integrated circuits and may control a shift timing of the scan signals (gate pulses). A gate output enable signal GOE may designate a timing information about one or more gate driver integrated circuits.

To control the data driving part 120, the timing controller 140 may output various data control signals DCS including, e.g., a source start pulse SSP, a source sampling clock SSC, and a source output enable signal SOE, but is not limited thereto.

The source start pulse SSP may control a start timing of a data sampling of one or more source driver integrated circuits constituting the data driving part 120. The source sampling clock SSC may be a clock signal configured to control the sampling timing of data in each source driver integrated circuit. The source output enable signal SOE may control an output timing of the data driving part 120.

The timing controller 140 may be implemented as a separate component from the data driving part 120, or the timing controller 140, along with the data driving part 120, may be implemented as an integrated circuit, but embodiments of the present disclosure are not limited thereto.

The data driving part 120 may receive the image data Data from the timing controller 140 and supply data voltage to the plurality of data lines DL, thereby driving the plurality of data lines DL. The data driving part 120 may be a source driving circuit, but is not limited thereto.

The data driving part 120 may include one or more source driver integrated circuit (SDICs). Each source driver integrated circuit (SDIC) may include a shift register, a latch circuit, a digital-to-analog converter (AAC), and an output buffer. In some cases, each source driver integrated circuit (SDIC) may further include an analog-digital converter ADC, but is not limited thereto.

For example, each source driver integrated circuit (SDIC) may be connected with the display panel 110 by a tape automated bonding (TAB) type or connected to a bonding pad of the display panel 110 by a chip on glass (COG) or chip on panel (COP) type or may be implemented by a chip on film (COF) type and connected with the display panel 110.

FIG. 1 illustrates that the data driving part 120 is disposed outside the display panel 110, but is not limited thereto. For example, the data driving part 120 may be disposed inside the display panel 110.

The gate driving part 130 may output a gate signal of a turn-on level voltage or a gate signal of a turn-off level voltage according to a control of the timing controller 140. The gate driving part 130 may drive the plurality of gate lines GL by sequentially supplying gate signals of the turn-on level voltage to the plurality of gate lines GL.

The gate driving part 130 may be connected with the display panel 110 by TAB method or connected to a bonding pad of the display panel 110 by a COG or COP method, or may be connected with the display panel 110 according to a COF method. Alternatively, the gate driving part 130 may be formed as a gate in panel (GIP) type, in the non-display area NA of the display panel 110. According to embodiments of the present disclosure, an example in which the gate driving part 130 is connected to a bonding pad of the display panel 110 in a chip on panel (COP) type is described, but embodiments of the present disclosure are not limited thereto.

FIG. 1 illustrates that the gate driving part 130 is disposed outside the display panel 110, but is not limited thereto. For example, the gate driving part 130 may be disposed inside the display panel 110.

When a specific gate line GL is opened by the gate driving part 130, the data driving part 120 may convert the image data received from the timing controller 140 into an analog data voltage and supply it to the plurality of data lines DL.

The data driving part 120 may be connected to one side (e.g., an upper side or lower side, or one portion, or an upper portion or lower portion) of the display panel 110. Depending on the driving scheme or the panel design scheme, the data driving part 120 may be connected with both sides (e.g., upper and lower sides, or both portions, or upper and lower portions) of the self-emission display panel 110, or two or more sides (or portions) among the four sides (or the four portions) of the self-emission display panel 110.

The gate driving part 130 may be connected with one side (e.g., a left side or right side, or one portion, or a left portion or right portion) of the display panel 110. Depending on the driving scheme or the panel design scheme, the gate driving part 130 may be connected with both sides (e.g., left and right sides, or both portions, or upper and lower portions) of the display panel 110, or two or more sides (or portions) among the four sides (or the four portions) of the display panel 110.

The timing controller 140 may be a timing controller used in display technology, or a control device that may perform other control functions as well as the functions of the timing controller, but is not limited thereto.

The timing controller 140 may be implemented as various circuits or electronic components, such as an integrated circuit (IC), a field programmable gate array (FPGA), an application specific integrated circuit (ASIC), or a processor, but is not limited thereto.

Figure 2:
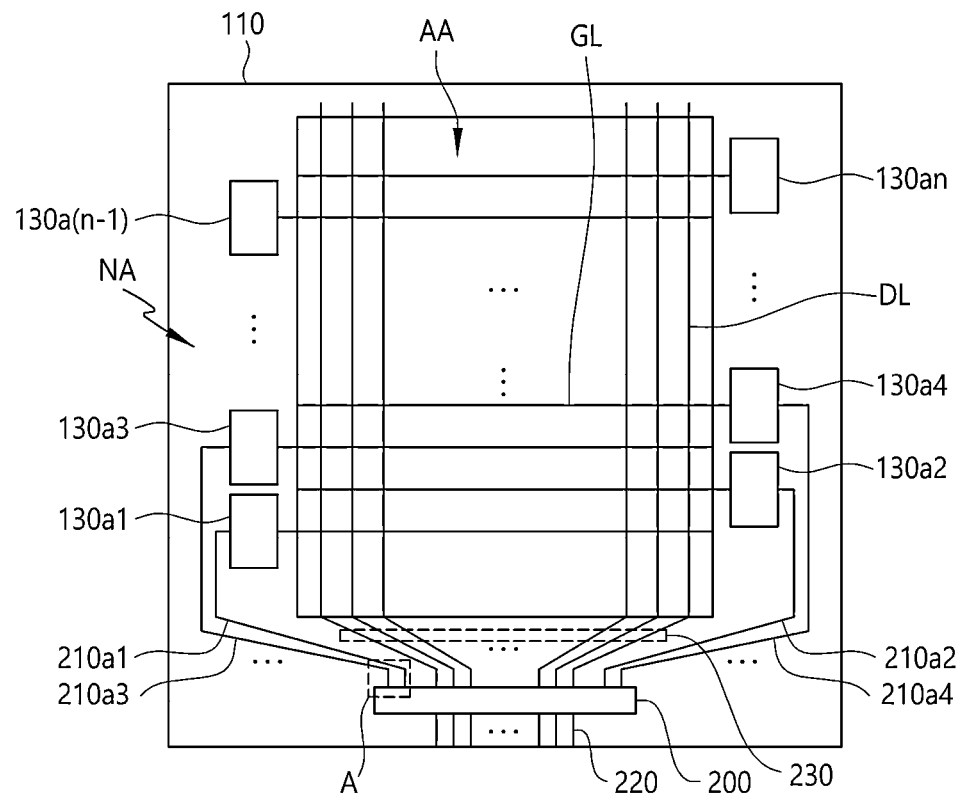
FIG. 2 illustrates a circuit structure of a display apparatus according to embodiments of the present disclosure.

FIG. 2 illustrates a circuit structure of a display apparatus according to embodiments of the present disclosure.

Referring to FIG. 2, a plurality of subpixels SP may be disposed in the display area AA.

A plurality of gate driving parts 130a1 to 130an and the driving chip 200 may be disposed at the non-display area NA of the display panel 110.

As illustrated in FIG. 2, the plurality of gate driving parts 130a1 to 130an may be disposed at the non-display areas NA on two sides (or two portions) of the display area AA, or may be disposed only at one portion of the two non-display areas NA, but are not limited thereto.

Each of the plurality of gate driving parts 130a1 to 130an may be connected to one gate line GL in the display area AA, or one gate driving part may be connected to all gate lines GL in the display area AA, but the disclosure is not limited thereto.

Hereinafter, for convenience of description, an example in which the plurality of gate driving parts 130a1 to 130an are disposed at each of the non-display areas NA on two opposite sides (or portions) of the display area AA, and each of the gate driving parts is connected to one gate line in the display area AA is described, but embodiments of the present disclosure are not limited thereto.

A plurality of gate driving parts 130a1 to 130an may be connected to gate lines GL, respectively, disposed at the display area AA.

The plurality of gate driving parts 130a1 to 130an may include a plurality of first gate driving parts 130a1 to 130a(n−1) connected to the gate line GL in the display area AA on one side (or one portion) adjacent to the display area AA, and a plurality of second gate driving parts 130a2 to 130an connected to the gate line GL in the display area AA on the other side (or the other portion) adjacent to the display area AA.

The plurality of second gate driving parts 130a2 to 130an may be gate driving parts outputting gate signals, but are not limited thereto, and may be light emitting driving parts outputting light emission control signals. When the plurality of second gate driving parts 130a2 to 130an are light emitting driving parts, the plurality of second gate driving parts 130a2 to 130an may be connected to a signal line configured to transmit a light emitting control signal.

FIG. 2 illustrates a structure in which a plurality of first gate driving parts 130a1 to 130a(n−1) and a plurality of second gate driving parts 130a2 to 130an are connected to different gate lines GL, but embodiments of the disclosure are not limited thereto, and the plurality of first gate driving parts 130a1 to 130a(n−1) and the plurality of second gate driving parts 130a2 to 130an may be connected to the same gate line GL. In this case, the total number of gate driving parts may be greater than that in the case in which the plurality of first gate driving parts 130a1 to 130a(n−1) and the plurality of second gate driving parts 130a2 to 130an are connected to different gate lines GL.

A plurality of gate lines 210a1 to 210an may be connected to the plurality of gate driving parts 130a1 to 130an, respectively.

The plurality of gate lines 210a1 to 210an may be lines that transfer signals configured to control the plurality of gate driving parts 130a1 to 130an.

For example, the first gate line 210a1 and the third gate line 210a3 may be lines that transfer gate clock signals to the first gate driving part 130a1 and the third gate driving part 130a3, respectively.

The plurality of gate lines 210a1 to 210an may be connected to the driving chip 200 at a portion different from a portion connected to the plurality of gate driving parts 130a1 to 130an.

The driving chip 200 may be disposed at the non-display area NA in the display panel 110, but embodiments of the present disclosure are not limited thereto.

The driving chip 200 may be connected to the plurality of gate lines 210a1 to 210an, a plurality of connection lines 230, and an external line 220 in the non-display area NA.

The driving chip 200 may include a data driving part and a timing controller. The timing controller may be disposed outside the display panel 110, but embodiments of the present disclosure are not limited thereto. When the timing controller is disposed outside the display panel 110, the timing controller may be connected to the display panel 110 through (or by) the external line 220.

The driving chip 200 may transfer a data voltage to the data line DL through (or by) a plurality of connection lines 230. The plurality of connection lines 230 may be connected to the data line DL.

The driving chip 200 may receive power through the external line 220. For example, the integrated circuit configured to supply power may supply power to the driving chip 200 through (or by) the external line 220.

Figure 3:
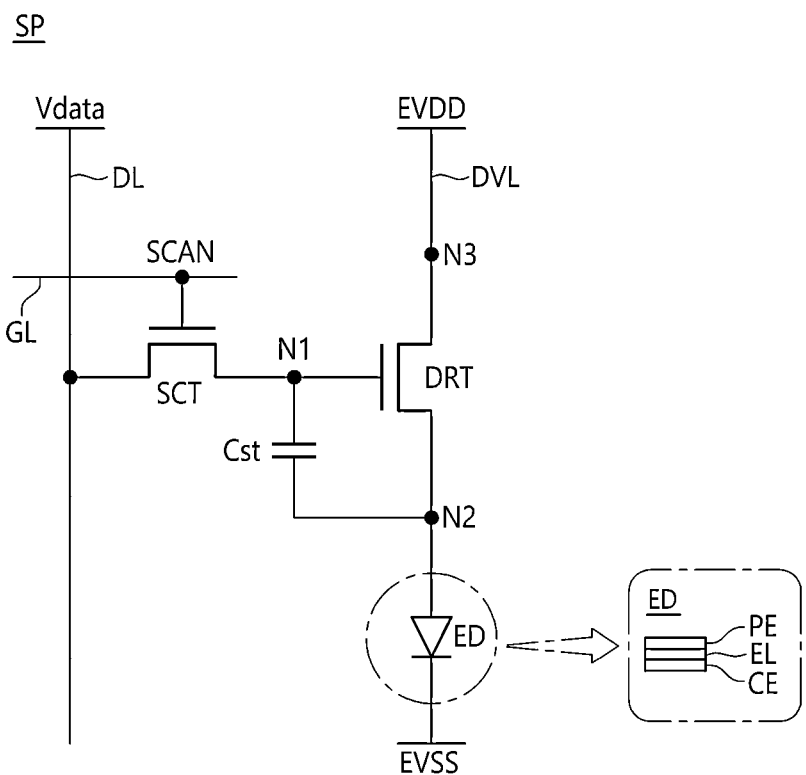
FIG. 3 is a circuit diagram of a subpixel of a display apparatus according to embodiments of the present disclosure.

FIG. 3 is a circuit diagram of a subpixel of a display apparatus according to embodiments of the present disclosure.

Referring to FIG. 3, each of a plurality of subpixels SP disposed at a display panel 110 of a display apparatus 100 according to embodiments of the present disclosure may include a light emitting element ED, a driving transistor DRT, a scan transistor SCT, and a storage capacitor Cst. If the subpixel SP includes the two transistors DRT and SCT and one capacitor Cst, the subpixel SP may be referred to as having a 2T (Transistor) 1C (Capacitor) structure.

The light emitting element ED may include a pixel electrode PE and a common electrode CE, and may further include a light emitting layer EL between the pixel electrode PE and the common electrode CE. The pixel electrode PE may be an anode electrode or a cathode electrode, but is not limited thereto. The common electrode CE may be a cathode electrode or an anode electrode, but is not limited thereto. For example, the light emitting element ED may be an organic light emitting diode OLED, a light emitting diode (LED), a mini-LED, a micro LED, or a quantum dot light emitting element, but is not limited thereto.

The driving transistor DRT may be a transistor configured to drive the light emitting element ED. The driving transistor DRT may include a first node N1, a second node N2, and a third node N3.

The first node N1 of the driving transistor DRT may be a gate node of the driving transistor DRT, and may be electrically connected with a source node or a drain node of the scan transistor SCT. The second node N2 of the driving transistor DRT may be a source node or a drain node of the driving transistor DRT, and may be electrically connected to the pixel electrode DE of the light emitting element ED. The third node N3 of the driving transistor DRT may be electrically connected with a driving voltage line DVL supplying a driving voltage EVDD.

The scan transistor SCT may be controlled by a gate signal (or scan signal) SCAN and may be connected between the first node N1 of the driving transistor DRT and the data line DL. For example, the scan transistor SCT may be turned on or off according to the gate signal SCAN supplied from the scan signal line SCL, controlling the connection between the data line DL and the first node N1 of the driving transistor DRT.

The scan transistor SCT may be turned on by the gate signal SCAN having a turn-on level voltage and transfer the data voltage Vdata supplied from the data line DL to the first node N1 of the driving transistor DRT.

Each of the driving transistor DRT and the scan transistor SCT may be an n-type transistor or a p-type transistor.

The storage capacitor Cst may be electrically connected between the first node N1 and second node N2 of the driving transistor DRT. The storage capacitor Cst may be charged with the quantity of electric charge corresponding to the voltage difference between both ends thereof and may maintain the voltage difference between both ends for a predetermined frame time. Accordingly, during the predetermined frame time, the corresponding subpixel SP may emit light.

The storage capacitor Cst is not a parasitic capacitor (e.g., Cgs or Cgd) which is an internal capacitor existing between the gate node and the source node (or drain node) of the driving transistor DRT, but may be an external capacitor intentionally designed outside the driving transistor DRT, but is not limited thereto.

The subpixel SP disposed at the display panel 110 may include one or more transistors for providing a compensation function for reducing the characteristic value deviation between driving transistors DRT or the characteristic value deviation between light emitting elements ED. In some cases, the subpixel may further include one or more capacitors. For example, the subpixel SP may have a circuit structure of 3T1C, 4T1C, 6T1C, 7T1C, 8T1C, or 8T2C, but is not limited to any one circuit structure.

Figure 4:
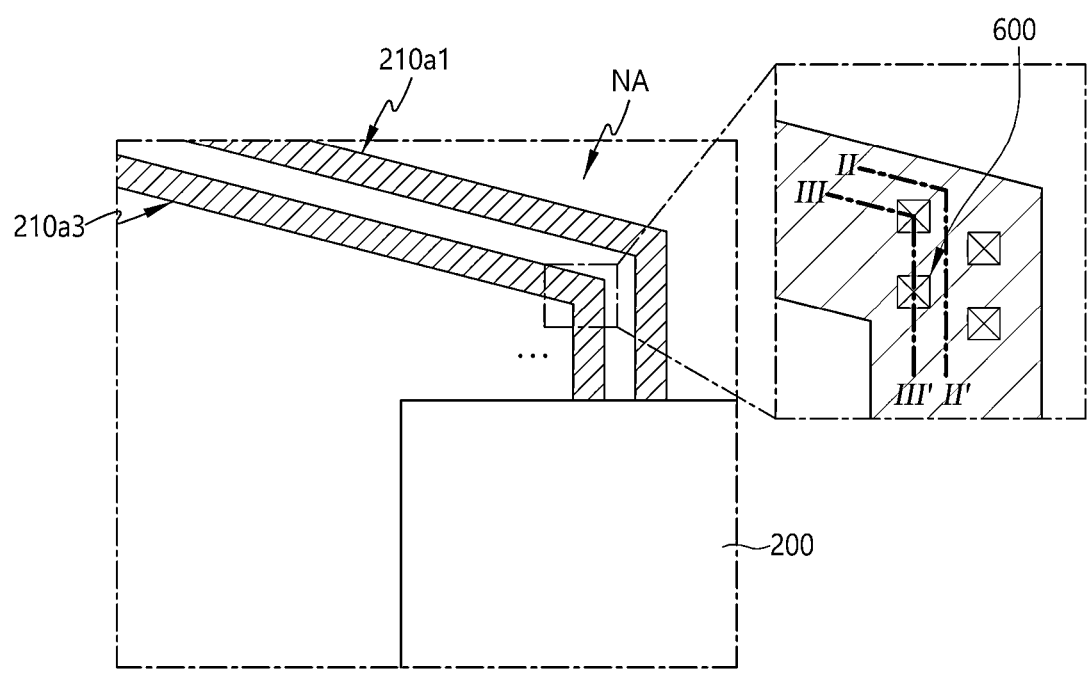
FIG. 4 is an enlarged view of area A of FIG. 2 according to embodiments of the present disclosure.
Figure 5:
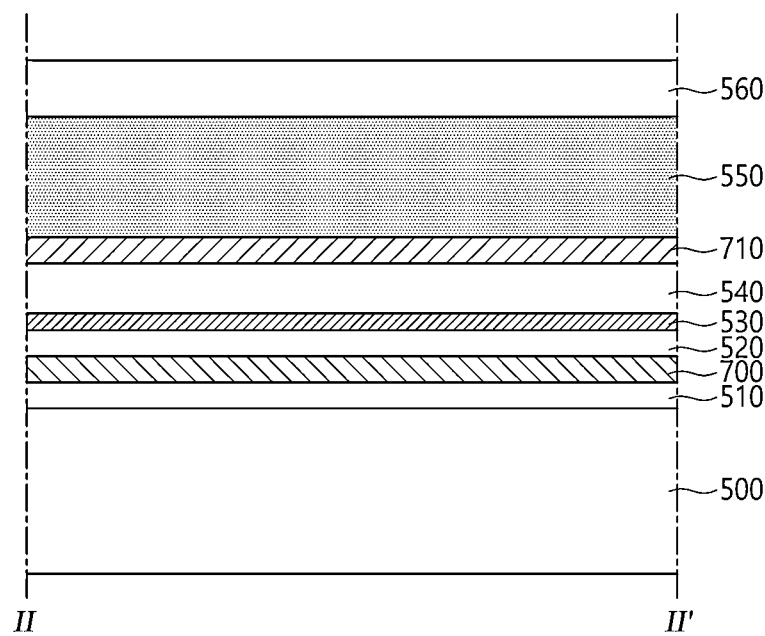
FIG. 5 illustrates an example taken along line II-II' of FIG. 4 according to embodiments of the present disclosure.
Figure 6:
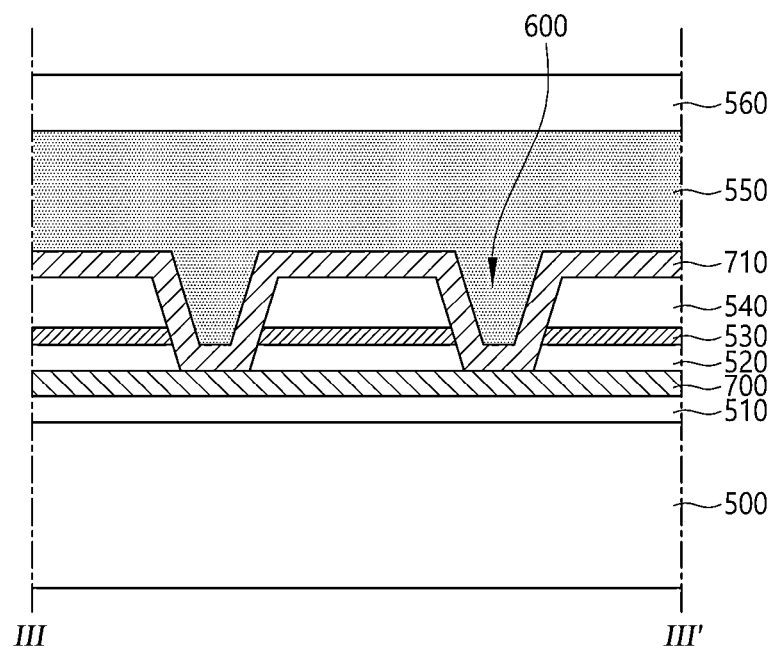
FIG. 6 illustrates an example taken along line III-III' of FIG. 4 according to embodiments of the present disclosure.

FIG. 4 is an enlarged view of area A of FIG. 2 according to embodiments of the present disclosure. FIG. 5 illustrates an example taken along line II-II' of FIG. 4 according to embodiments of the present disclosure. FIG. 6 illustrates an example taken along line III-III' of FIG. 4 according to embodiments of the present disclosure.

Referring to FIG. 5, a display panel 110 may include a substrate 500, a first buffer layer 510, a first insulation layer 520, a first line 530, a second insulation layer 540, a third insulation layer 550, and a second buffer layer 560.

The substrate 500 may support various components of the display apparatus. The substrate 500 may be formed of a plastic material such as polyimide, but is not limited thereto.

An inorganic film may be further formed on the substrate 500 to prevent or at least reduce moisture penetration. The inorganic film may be formed of a single layer of silicon nitride (SiNx) or silicon oxide (SiOx) or multiple layers thereof, but is not limited thereto. A first buffer layer 510 may be disposed on the substrate 500.

The first buffer layer 510 may block an alkali component or the like discharged from the substrate 500.

The first buffer layer 510 may be formed of a single layer of silicon nitride (SiNx) or silicon oxide (SiOx) or multiple layers thereof, but is not limited thereto. When the first buffer layer 510 is formed of multiple layers, silicon oxide (SiOx) and silicon nitride (SiNx) may be alternately formed, but are not limited thereto.

The first insulation layer 520 may be disposed on the first buffer layer 510.

The first insulation layer 520 may insulate the gate electrode in the transistor from the semiconductor pattern. The first insulation layer 520 may be formed of a single layer of silicon nitride (SiNx) or silicon oxide (SiOx) or multiple layers thereof, but embodiments of the present disclosure are not limited thereto.

The first line 530 may be disposed on the first insulation layer 520.

The first line 530 may be formed of a single layer or multiple layers of any one of molybdenum (Mo), copper (Cu), titanium (Ti), aluminum (Al), chromium (Cr), nickel (Ni), neodymium (Nd), tungsten (W), and gold (Au), or an alloy thereof, but is not limited thereto.

The first line 530 may be a gate line electrically connected to the driving chip to transfer a signal configured to control the gate driving part from the driving chip. For example, the first line 530 may be a line that transfers the gate clock signal to the gate driving part.

The first line 530 may be a third gate line 210a3. Hereinafter, for convenience of description, the third gate line 210a3 is described as the first line 530.

The second insulation layer 540 may be disposed on the first line 530. The second insulation layer 540 may be formed of a single layer of silicon nitride (SiNx) or silicon oxide (SiOx) or multiple layers thereof, but embodiments of the present disclosure are not limited thereto.

The third insulation layer 550 may be disposed on the second insulation layer 540.

The third insulation layer 550 may protect the thin film transistor and may alleviate or flatten the step due to various patterns.

The third insulation layer 550 may be formed of at least one or more of materials, such as benzocyclobutene (BCB), acrylic resin, epoxy resin, phenolic resin, polyamide resin, or polyimide resin, but is not limited thereto. The third insulation layer 550 may be disposed as a single layer, but may be disposed as two or more layers considering the arrangement of electrodes.

The second buffer layer 560 may be disposed on the third insulation layer 550.

The second buffer layer 560 may be formed of a single layer or multiple layers of silicon oxide (SiOx) or silicon nitride (SiNx), but is not limited thereto.

The driving chip may be disposed on the second buffer layer 560.

Referring to FIG. 2 together, the driving chip 200 may be disposed on the plurality of gate lines 210a1 to 210an in the non-display area NA of the display panel 110. For example, the driving chip 200 may be disposed on the first gate line 210a1 and the third gate line 210a3.

The driving chip 200 may be attached to the display panel 110 through a plurality of bonding pads. Further, the driving chip 200 may be electrically connected to the plurality of gate lines 210a1 to 210an through some of the plurality of bonding pads.

The plurality of gate lines 210a1 to 210an may partially overlap the driving chip 200 in an area where the driving chip 200 is connected to the plurality of bonding pads of the display panel 110.

A thickness of the display panel 110 in an area where the driving chip 200 and the plurality of gate lines 210a1 to 210an overlap may be larger than a thickness of the display panel 110 in an area where the driving chip 200 and the plurality of gate lines 210a1 to 210an do not overlap.

For example, the display panel 110 may further include at least one line layer in the area in which the driving chip 200 and the plurality of gate lines 210a1 to 210an overlap, compared to the area in which the driving chip 200 and the plurality of gate lines 210a1 to 210an do not overlap. Therefore, the thickness of the display panel 110 may be thicker in the area in which the driving chip 200 and the plurality of gate lines 210a1 to 210an overlap.

Accordingly, an external force applied when the driving chip 200 is attached to the display panel 110 may be more concentrated in the area where the driving chip 200 and the plurality of gate lines 210a1 to 210an overlap. Accordingly, cracks may occur in the area where the plurality of gate lines 210a1 to 210an are disposed.

The area where cracks occur may be an area adjacent to the driving chip 200 in the area where the plurality of gate lines 210a1 to 210an are disposed and/or near the area where the first gate line 210a1 or the third gate line 210a3 is bent.

When the driving chip 200 is attached on the second buffer layer 560, an external force is applied from a top (or an upper portion) to a bottom (or a lower portion) of the second buffer layer 560, and thus a crack may occur from an upper portion of the display panel 110.

The crack generated from the upper portion of the display panel 110 may penetrate the second buffer layer 560, the third insulation layer 550, and the second insulation layer 540, and may reach to the first line 530.

When the crack reaches to the first line 530 and the first line 530 is damaged, the signal transferred through the first line 530 such as the gate clock signal may be cut off.

When the signal transferred through the first line 530 is cut off, the gate driving part and the gate line may not operate properly, and the subpixel SP disposed in the display panel 110 may not operate normally, and thus a defect may occur in the display screen.

Referring to FIGS. 4 and 5, a second line 700 may be further disposed on the first buffer layer 510.

The second line 700 may be formed of a single layer or multiple layers of any one of molybdenum (Mo), copper (Cu), titanium (Ti), aluminum (Al), chromium (Cr), nickel (Ni), neodymium (Nd), tungsten (W), and gold (Au), or an alloy thereof, but is not limited thereto.

The second line 700 may be disposed between the first buffer layer 510 and the first insulation layer 520.

The second line 700 may be disposed lower than the first line 530.

Since the driving chip is attached on the second buffer layer 560, the vertical distance from the driving chip to the second line 700 may be larger than the vertical distance from the driving chip to the first line 530.

The second line 700 may be electrically connected to the first line 530. This is described below in detail.

As the second line 700 is electrically connected to the first line 530, the second line 700 may be an electrode that receives a signal configured to control the gate driving part from the driving chip and transfers the signal to the gate driving part.

The second line 700 may transfer a same signal as the first line 530.

For example, when the first line 530 transfers the gate clock signal, the second line 700 may transfer the gate clock signal in a same manner.

The second line 700 may be disposed along a path along which the first line 530 is disposed.

The second line 700 may at least partially overlap the first line 530.

A width of the second line 700 on the plane may be a same as a width of the first line 530, but is not limited thereto, and may be larger than the width of the first line 530 or smaller than the width of the first line 530.

Although FIGS. 4 and 5 illustrate a structure in which the second line 700 is disposed only under the first line 530, the second line 700 may be disposed under all of the plurality of gate lines 210a1 to 210an, and may be disposed along each of the paths in which the plurality of gate lines 210a1 to 210an are disposed.

A first line electrode 710 may be disposed on the second insulation layer 540.

The first line electrode 710 may be formed of a triple layer of titanium (Ti), aluminum (Al), and titanium (Ti), but is not limited thereto.

The first line electrode 710 may be disposed between the second insulation layer 540 and the third insulation layer 550.

The first line electrode 710 may be disposed higher than the first line 530.

Since the driving chip is attached on the second buffer layer 560, the vertical distance from the driving chip to the first line electrode 710 may be smaller than the vertical distance from the driving chip to the first line 530. As used herein, the vertical distance may refer to a distance in the direction perpendicular or substantially perpendicular to the substrate 500 or the plane thereof.

The first line electrode 710 may be electrically connected to the first line 530 and the second line 700. This is described below in detail.

The first line electrode 710 may be disposed along the path along which the first line 530 is disposed.

The first line electrode 710 may at least partially overlap the first line 530.

The width of the first line electrode 710 on the plane may be the same as the width of the first line 530, but is not limited thereto. For example, the width of the first line 530 may be larger or smaller than the width of the first line 530.

Although FIGS. 4 and 5 illustrate a structure in which the first line electrode 710 is disposed on the first line 530, the first line electrode 710 may be disposed along each of the paths in which the plurality of gate lines 210a1 to 210an are disposed on all of the plurality of gate lines 210a1 to 210an.

Referring to FIGS. 4 and 6, at least one contact hole 600 may be formed in the path on which the first line 530 is disposed.

The contact hole 600 may pass through a portion of the second insulation layer 540, the first line 530, and the first insulation layer 520.

The first line electrode 710 may be disposed to cover a bottom surface and a side surface of the contact hole 600. For example, the first line electrode 710 may be disposed to cover both the bottom surface and the side surface of the contact hole 600.

The first line electrode 710 disposed on the bottom surface of the contact hole 600 may contact the second line 700. The first line electrode 710 may be electrically connected to the second line 700 through or via the contact hole 600.

The first line electrode 710 disposed on the side surface of the contact hole 600 may contact the first line 530. The first line electrode 710 may be electrically connected to the first line 530 through or via the contact hole 600.

Since the first line electrode 710 is electrically connected to each of the first line 530 and the second line 700 through or via the contact hole 600, the first line 530 may be electrically connected to the second line 700. Accordingly, the first line 530 and the second line 700 may transfer a same signal. The present disclosure is not limited thereto. For example, the first line electrode 710 may be connected to the first line 530 through a contact hole, and the second line 700 may be connected to the first line 530 through another contact hole. That is, the first line electrode 710 and the second line 700 are electrically connected to each other by the first line 530. For example, the first line 530 and the second line 700 may be connected to each other by the first line electrode 710 at a portion connected to the first line and the second line, where the portion of the first line electrode 710 connected to the first line 530 and the second line 700 may be a portion of the first line electrode disposed at or on the contact hole 600. Here, the portion of the first line electrode 710 may be the portion disposed at the bottom and/or side surfaces of the contact hole 600.

The display apparatus according to embodiments of the present disclosure may include a first line electrode 710 disposed along the path along which the first line 530 is disposed. Since the first line electrode 710 is disposed higher than the first line 530, it is possible to prevent cracks, which may occur in the upper portion of the display panel from reaching the first line 530 when the driving chip is attached to the display panel 110.

Further, the display apparatus according to the present disclosure may include the second line 700 disposed along the path along which the first line 530 is disposed. Since the second line 700 is disposed lower than the first line 530 and is electrically connected to the first line 530, a gate control signal may be transferred through the second line 700 even when the first line 530 is partially damaged due to a crack when the driving chip is attached to the display panel. Accordingly, it is possible to prevent defects in the display screen.

According to embodiments of the present disclosure, since a dual line is configured between the substrate and the protection layer, it is possible to prevent screen defects by minimizing or at least reducing cracks that may occur when attaching the driving chip to the display panel 110.

According to embodiments of the present disclosure, since a dual line is configured between the substrate and the protection layer, it is possible to prevent disconnection of a gate line by minimizing or at least reducing delamination of layers disposed around the driving chip.

Figure 7:
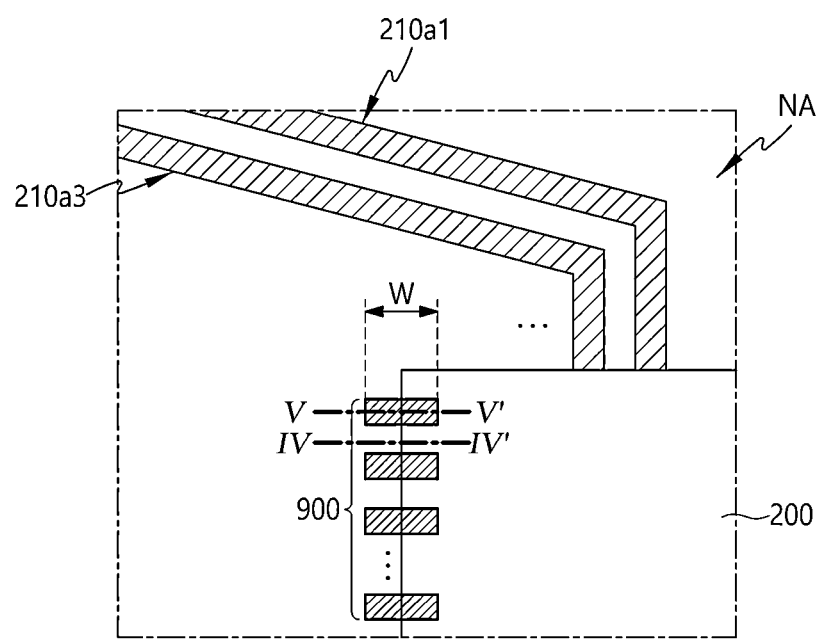
FIG. 7 illustrates another example of the structure shown in FIG. 4 according to embodiments of the present disclosure.
Figure 8:
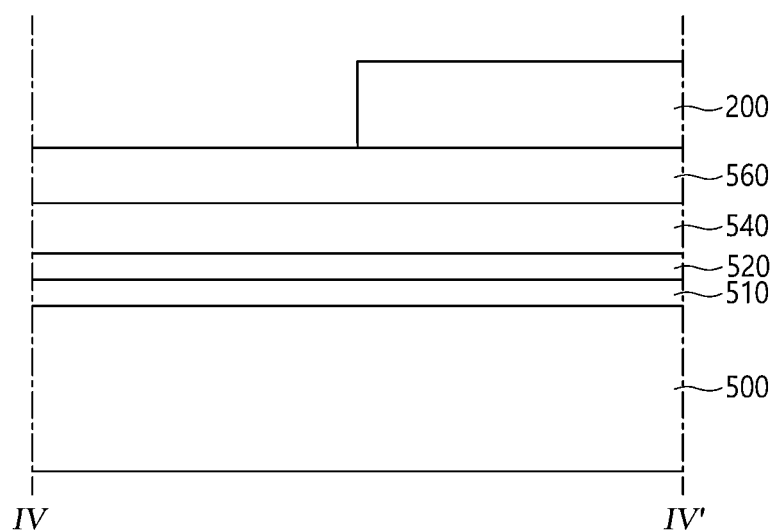
FIG. 8 illustrates an example taken along line IV-IV' of FIG. 7 according to embodiments of the present disclosure.
Figure 9:
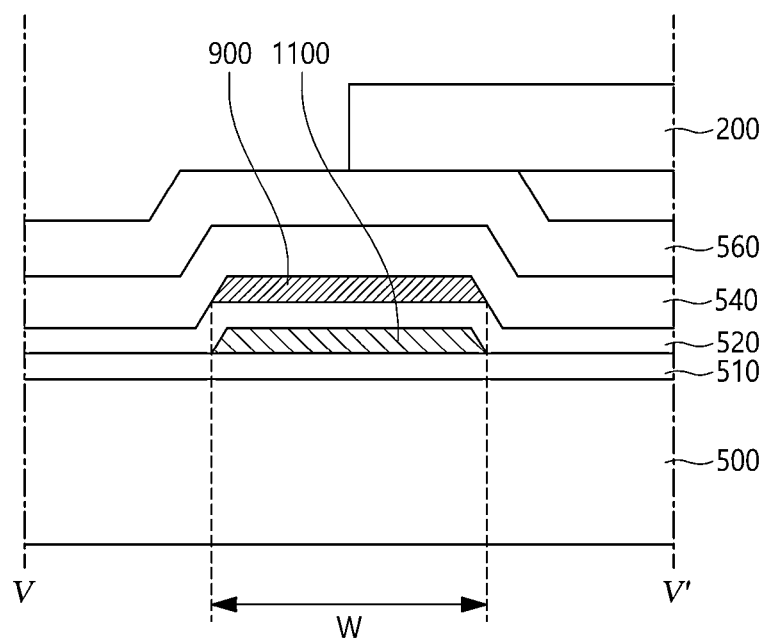
FIG. 9 illustrates an example taken along line V-V' of FIG. 7 according to embodiments of the present disclosure.

FIG. 7 illustrates another example of the structure shown in FIG. 4 according to embodiments of the present disclosure. FIG. 8 illustrates an example taken along line IV-IV' of FIG. 7 according to embodiments of the present disclosure. FIG. 9 illustrates an example taken along line V-V' of FIG. 7 according to embodiments of the present disclosure.

In describing the embodiments, descriptions of elements substantially identical to or corresponding to those of the previous embodiments will be omitted.

Referring to FIGS. 7 and 8, a first buffer layer 510 may be disposed on the substrate 500. The first insulation layer 520 may be disposed on the first buffer layer 510. A second insulation layer 540 may be disposed on the first insulation layer 520. A second buffer layer 560 may be disposed on the second insulation layer 540.

The driving chip 200 may be disposed in a partial area on the second buffer layer 560.

The driving chip 200 may be disposed on or attached to the second buffer layer 560 through a plurality of bonding pads.

As illustrated in FIGS. 7 and 8, the driving chip 200 may not overlap the plurality of gate lines 210a1 to 210an in an area overlapping the line IV-IV' in an area where the driving chip 200 is disposed.

The area where the driving chip 200 and the plurality of gate lines 210a1 to 210an do not overlap, e.g., the area overlapping the line IV-IV' in the area where the driving chip 200 is disposed, does not include a line layer. Therefore, a thickness of the display panel 110 in the area overlapping the line IV-IV' in the area where the driving chip 200 is disposed may be smaller than the area where the driving chip 200 and the plurality of gate lines 210a1 to 210an overlap.

Referring to FIGS. 7 and 9, the display apparatus may include a plurality of dummy electrodes 900 and 1100.

The plurality of dummy electrodes 900 and 1100 may include a plurality of first dummy electrodes 900 and a plurality of second dummy electrodes 1100.

The plurality of first dummy electrodes 900 and the plurality of second dummy electrodes 1100 may be disposed in the area at least partially overlapping the area where the driving chip 200 is disposed.

The plurality of first dummy electrodes 900 and the plurality of second dummy electrodes 1100 may overlap the driving chip 200 on a side surface different from the side surface in which the driving chip 200 is connected to the plurality of gate lines 210a1 to 210an.

The horizontal widths of the plurality of first dummy electrodes 900 and the plurality of second dummy electrodes 1100 may be W. The horizontal direction is perpendicular to the vertical direction described herein and may be parallel to, or substantially parallel to, the substrate 500 or the plane thereof.

The plurality of second dummy electrodes 1100 may be disposed between the first buffer layer 510 and the first insulation layer 520.

The plurality of second dummy electrodes 1100 may be formed of a same material as the second line, but are not limited thereto.

The plurality of first dummy electrodes 900 may be disposed between the first insulation layer 520 and the second insulation layer 540.

The vertical distance from the driving chip 200 to the plurality of second dummy electrodes 1100 may be larger than the vertical distance from the driving chip 200 to the plurality of first dummy electrodes 900.

The plurality of first dummy electrodes 900 may be formed of a same material as the first line, but are not limited thereto.

According to embodiments of the present disclosure, since the plurality of dummy electrodes 900 and 1100 are disposed to at least partially overlap the area where the driving chip 200 is disposed, the area overlapping the line V-V' in the area where the driving chip 200 is disposed may include at least one line layer. Accordingly, the thickness of the display panel 110 in the area where the driving chip 200 overlaps the line V-V' may be larger than the thickness of the display panel 110 in the area where the driving chip 200 overlaps the line IV-IV'.

For example, as the plurality of dummy electrodes 900 and 1100 are disposed, the thickness of the display panel 110 may increase in the area where the driving chip 200 does not overlap the plurality of gate lines 210*a*1 to 210*an* in the area where the driving chip 200 is disposed.

Accordingly, concentration of the external force applied when the driving chip 200 is attached to the display panel 110 on the area where the driving chip 200 and the plurality of gate lines 210*a*1 to 210*an* overlap may be relieved. Accordingly, it is possible to prevent cracks from occurring around the area where the driving chip 200 is disposed.

According to embodiments of the present disclosure, since a dummy electrode is configured around the driving chip, it is possible to minimize delamination and cracks of layers disposed around the driving chip and to prevent disconnection and corrosion of a gate line.

A display apparatus according to embodiment of the present disclosure may be applied to mobile apparatuses, video phones, smart watches, watch phones, wearable apparatuses, foldable apparatuses, rollable apparatuses, bendable apparatuses, flexible apparatuses, curved apparatuses, slidable apparatuses, variable apparatuses, electronic notebooks, electronic books, portable multimedia players (PMPs), personal digital assistants (PDAs), MP3 players, mobile medical apparatuses, desktop PCs, laptop PCs, netbook computers, workstations, navigation apparatuses, vehicle navigations, vehicle displays, vehicle apparatuses, theater apparatuses, theater displays, televisions, wallpaper apparatuses, signage apparatuses, game apparatuses, laptop computers, monitors, cameras, camcorders, and home appliances.

A display apparatus according to various embodiments of the present disclosure may be described as follows.

A display apparatus according to various embodiments of the present disclosure may comprise a substrate including a display area and a non-display area around the display area, a gate driving part at the non-display area on the substrate, a driving chip at the non-display area on the substrate, a first line on the substrate, the first line electrically connected to the driving chip, and a second line between the substrate and the first line.

The display apparatus according to various embodiments of the present disclosure may further comprise a first line electrode on the first line, the first line electrode connected to the first line and the second line.

According to various embodiments of the present disclosure, the first line and the second line may be electrically connected to each other by the first line electrode.

According to various embodiments of the present disclosure, a vertical distance from the driving chip to a layer where the first line electrode may be disposed may be less than a vertical distance from the driving chip to a layer where the first line is disposed.

According to various embodiments of the present disclosure, at least a portion of the first line and the second line may overlap an area where the driving chip is disposed.

According to various embodiments of the present disclosure, a vertical distance from the driving chip to a layer where the second line is disposed may be greater than a vertical distance from the driving chip to a layer where the first line is disposed.

According to various embodiments of the present disclosure, the display apparatus may further comprise a plurality of first dummy electrodes at least some of which overlap an area where the driving chip is disposed at the non-display area, and a plurality of second dummy electrodes that overlap each of the plurality of first dummy electrodes, the plurality of second dummy electrodes between the substrate and the plurality of first dummy electrodes.

According to various embodiments of the present disclosure, the plurality of first dummy electrodes may be on a same layer as the first line. The plurality of second dummy electrodes may be on a same layer as the second line.

According to various embodiments of the present disclosure, a vertical distance from the driving chip to the substrate in an area where the plurality of first dummy electrodes overlap the driving chip may be equal to a vertical distance from the driving chip to the substrate in an area where the first line overlaps the driving chip.

According to various embodiments of the present disclosure, the plurality of first dummy electrodes may include a same material as the first line. The plurality of second dummy electrodes may include a same material as the second line.

According to various embodiments of the present disclosure, a same signal may be applied to the first line and the second line such that the second line may transfer a same signal as the first line.

According to various embodiments of the present disclosure, the first line electrode and the second line may be electrically connected to each other by the first line.

According to various embodiments of the present disclosure, the first line may contact a portion of the first line electrode on a side surface of a contact hole, and the second line may contact a portion of the first line electrode on a bottom surface of the contact hole.

A display apparatus according to an embodiment of the present disclosure may comprise a substrate including a display area and a non-display area around the display area, a gate driving part at the non-display area on the substrate, a driving chip at the non-display area on the substrate, a first line on the substrate, and the first line electrically connected to the driving chip, and a plurality of dummy electrodes at least some of which on a same layer as the first line.

According to various embodiments of the present disclosure, the plurality of dummy electrodes may overlap an area where the driving chip is disposed.

According to various embodiments of the present disclosure, the plurality of dummy electrodes may include a first dummy electrode and a second dummy electrode. According to various embodiments of the present disclosure, the first dummy electrode may be on the same layer as the first line. According to various embodiments of the present disclosure, the second dummy electrode may overlap the first dummy electrode and may be under the first dummy electrode.

According to various embodiments of the present disclosure, a vertical distance from the driving chip to the second dummy electrode may be greater than a vertical distance from the driving chip to the first dummy electrode.

According to various embodiments of the present disclosure, the display apparatus may further comprise a second line between the substrate and the first line and disposed along the first line. According to various embodiments of the present disclosure, the second dummy electrode may be on a same layer as the second line.

According to various embodiments of the present disclosure, the first dummy electrode may include a same material as the first line. According to various embodiments of the present disclosure, the second dummy electrode may include a same material as the second line.

According to various embodiments of the present disclosure, a vertical distance from the driving chip to the substrate in an area where the first dummy electrode overlaps the driving chip may be equal to a vertical distance from the driving chip to the substrate in an area where the first line overlaps the driving chip.

It will be apparent to those skilled in the art that various modifications and variations may be made in the present disclosure without departing from the scope of the disclosures. Thus, it is intended that the present disclosure covers the modifications and variations of this disclosure provided they come within the scope of the appended claims and their equivalents.

What is claimed is:

1. A display apparatus, comprising:
   a substrate including a display area and a non-display area around the display area;
   a gate driving part at the non-display area on the substrate;
   a driving chip at a first area in the non-display area on the substrate;
   a first line on the substrate,
   a second line between the substrate and the first line;
   a first insulating layer between the first line and the second line;
   a first line electrode on the first insulating layer;
   a second insulating layer between the first line electrode and the first line; and
   a third insulating layer on the first line electrode,
   wherein the first line electrode connects the first line connected to the first area to the second line,
   wherein the second line is connected to the gate driving part,
   wherein the second insulating layer includes an inorganic material,
   wherein the first insulating layer and the second insulating layer are thinner than the third insulating layer,
   wherein the first insulating layer, the second insulating layer, and the first line are disconnected in a second area closer to the display area than the first area, and
   wherein in the second area, the first line electrode is in contact with at least one side of the disconnected portion of the first line, and is in contact with an upper surface of the second line.

2. The display apparatus of claim 1, wherein the first line and the second line are electrically connected to each other by the first line electrode.

3. The display apparatus of claim 2, wherein the first line contacts a portion of the first line electrode on a side surface of a contact hole, and the second line contacts a portion of the first line electrode on a bottom surface of the contact hole.

4. The display apparatus of claim 1, wherein a vertical distance from the driving chip to a layer where the first line electrode is disposed is less than a vertical distance from the driving chip to a layer where the first line is disposed.

5. The display apparatus of claim 1, wherein at least a portion of the first line and the second line overlaps an area where the driving chip is disposed.

6. The display apparatus of claim 1, wherein a vertical distance from the driving chip to a layer where the second line is disposed is greater than a vertical distance from the driving chip to a layer where the first line is disposed.

7. The display apparatus of claim 1, further comprising:
   a plurality of first dummy electrodes at least some of which overlap an area where the driving chip is disposed in the non-display area; and
   a plurality of second dummy electrodes that overlap each of the plurality of first dummy electrodes, the plurality of second dummy electrodes between the substrate and the plurality of first dummy electrodes.

8. The display apparatus of claim 7, wherein the plurality of first dummy electrodes are on a same layer as the first line, and the plurality of second dummy electrodes are on a same layer as the second line.

9. The display apparatus of claim 7, wherein a vertical distance from the driving chip to the substrate in an area where the plurality of first dummy electrodes overlap the driving chip is equal to a vertical distance from the driving chip to the substrate in an area where the first line overlaps the driving chip.

10. The display apparatus of claim 7, wherein the plurality of first dummy electrodes include a same material as the first line, and the plurality of second dummy electrodes include a same material as the second line.

11. The display apparatus of claim 1, wherein a same signal is applied to the first line and the second line.

12. A display apparatus, comprising:
   a substrate including a display area and a non-display area around the display area;
   a gate driving part at the non-display area on the substrate;
   a driving chip at a first area in the non-display area on the substrate;
   a first line on the substrate;
   a first line electrode on the first line;
   a first insulating layer under the first line;
   a second insulating layer between the first line electrode and the first line;
   a third insulating layer on the first line electrode; and
   a plurality of dummy electrodes at least some of which on a same layer as the first line,
   wherein the plurality of dummy electrodes include a first dummy electrode and a second dummy electrode,
   wherein the first dummy electrode is on a same layer as the first line, and the second dummy electrode overlaps the first dummy electrode and is under the first dummy electrode, wherein the second insulating layer includes an inorganic material, wherein the first insulating layer and the second insulating layer are thinner than the third insulating layer, wherein the first insulating layer, the second insulating layer, and the first line are disconnected in a second area closer to the display area than the first area, and wherein in the second area, the first line electrode is in contact with at least one side of the disconnected portion of the first line.

13. The display apparatus of claim 12, wherein the plurality of dummy electrodes overlap an area where the driving chip is disposed.

14. The display apparatus of claim 12, wherein a vertical distance from the driving chip to the second dummy electrode is greater than a vertical distance from the driving chip to the first dummy electrode.

15. The display apparatus of claim 12, further comprising:
a second line between the substrate and the first line and disposed along the first line,
wherein the second dummy electrode is on a same layer as the second line.

16. The display apparatus of claim 15, wherein the first dummy electrode includes a same material as the first line, and the second dummy electrode includes a same material as the second line.

17. The display apparatus of claim 12, wherein a vertical distance from the driving chip to the substrate in an area where the first dummy electrode overlaps the driving chip is equal to a vertical distance from the driving chip to the substrate in an area where the first line overlaps the driving chip.

* * * * *